(12) United States Patent
Pei (10) Patent No.: US 9,735,749 B2
(45) Date of Patent: Aug. 15, 2017

(54) RADIO FREQUENCY RECEIVER AND AUTOMATIC GAIN CONTROL METHOD OF RADIO FREQUENCY RECEIVER

(71) Applicant: Huawei Technologies Co., Ltd., Shenzhen (CN)

(72) Inventor: Xinxin Pei, Shenzhen (CN)

(73) Assignee: Huawei Technologies Co., Ltd.

( * ) Notice: Subject to any disclaimer, the term of this patent is extended or adjusted under 35 U.S.C. 154(b) by 0 days.

(21) Appl. No.: 14/946,908

(22) Filed: Nov. 20, 2015

(65) Prior Publication Data

US 2016/0150489 A1 May 26, 2016

(30) Foreign Application Priority Data

Nov. 21, 2014 (CN) .......................... 2014 1 0677482

(51) Int. Cl.
*H03G 3/00* (2006.01)
*H04B 17/00* (2015.01)
(Continued)

(52) U.S. Cl.
CPC ......... *H03G 3/3047* (2013.01); *H03G 3/3078* (2013.01); *H04B 17/26* (2015.01);
(Continued)

(58) Field of Classification Search
CPC ...... H04B 17/26; H04W 52/52; H04L 27/265; H03G 3/3047; H03G 3/001; H03G 3/3078
See application file for complete search history.

(56) References Cited

U.S. PATENT DOCUMENTS 7,961,214 B2 * 6/2011 Grodevant ........... G02B 21/008
348/255
2005/0047533 A1 * 3/2005 Ruelke ................... H03G 3/001
375/345
(Continued)

FOREIGN PATENT DOCUMENTS

CN 001224967 A 8/1999
CN 1741376 A 3/2006
(Continued)

OTHER PUBLICATIONS

Partial English Translation and Abstract of Chinese Patent Application No. CN101742627, Mar. 31, 2016, 24 pages.
(Continued)

*Primary Examiner* — Michelle M Koeth
(74) *Attorney, Agent, or Firm* — Conley Rose, P.C.

(57) ABSTRACT

A radio frequency receiver and an automatic gain control method of the radio frequency receiver is presented. The radio frequency receiver includes an automatic gain control apparatus, a radio frequency component, and an analog to digital converter, where the automatic gain control apparatus further includes: an intensity calculator configured to calculate a relationship between an intensity representation parameter of digital data and a preset intensity threshold within a preset calculation time; and an automatic gain controller configured to compare the relationship calculated by the intensity calculator with a preset relationship threshold, and adjust a gain of the radio frequency component on radio frequency data according to a comparison result, so that an amplitude of the radio frequency data obtained after the gain adjustment is within a receiving range of the analog to digital converter.

22 Claims, 4 Drawing Sheets

(51) Int. Cl.
 H03G 3/30 (2006.01)
 H04W 52/52 (2009.01)
 H04L 27/26 (2006.01)
 H04B 17/26 (2015.01)
(52) U.S. Cl.
 CPC ........... *H04L 27/265* (2013.01); *H04W 52/52* (2013.01); *H03G 3/001* (2013.01)

(56) References Cited

U.S. PATENT DOCUMENTS

| | | | |
|---|---|---|---|
| 2006/0044065 A1 | 3/2006 | Ishida | |
| 2008/0074185 A1* | 3/2008 | Ishida | H03G 3/3026 330/129 |
| 2010/0034327 A1 | 2/2010 | Rimini | |
| 2010/0284450 A1 | 11/2010 | Ejima | |
| 2012/0244825 A1* | 9/2012 | Green | H03G 3/3052 455/226.1 |
| 2012/0294398 A1 | 11/2012 | Yucek et al. | |
| 2016/0119886 A1* | 4/2016 | Li | H04W 52/52 375/345 |

FOREIGN PATENT DOCUMENTS

| | | |
|---|---|---|
| CN | 101237261 A | 8/2008 |
| CN | 101742627 A | 6/2010 |
| CN | 102186233 A | 9/2011 |
| CN | 102316567 A | 1/2012 |

OTHER PUBLICATIONS

Foreign Communication From a Counterpart Application, Chinese Application No. 201410677482.4, Chinese Office Action dated Mar. 2, 2016, 6 pages.
Partial English Translation and Abstract of Chinese Patent Application No. CN101237261, dated Nov. 2, 2016, 14 pages.
Foreign Communication From a Counterpart Application, Chinese Application No. 201410677482.4, Chinese Office Action dated Oct. 8, 2016, 6 pages.

* cited by examiner

RADIO FREQUENCY RECEIVER AND AUTOMATIC GAIN CONTROL METHOD OF RADIO FREQUENCY RECEIVER

CROSS-REFERENCE TO RELATED APPLICATIONS

This application claims priority to Chinese Patent Application No. 201410677482.4, filed on Nov. 21, 2014, which is hereby incorporated by reference in its entirety.

TECHNICAL FIELD

The present disclosure relates to the field of communications technologies, and in particular, to a radio frequency receiver and an automatic gain control method of the radio frequency receiver.

BACKGROUND

In wireless communications, an amplitude of radio frequency data, that is, a radio frequency signal, received by a radio frequency receiver changes dramatically. To ensure performance of the radio frequency receiver, the radio frequency receiver needs to support a large dynamic receive range. To reduce bit width and reduce costs, it is required to adjust, in an automatic gain control (AGC) manner, the radio frequency data according to the amplitude of the received radio frequency data, so as to adjust the amplitude of the received radio frequency data to a proper range, and then perform quantizing using an analog to digital converter (ADC), so as to achieve a purpose of reducing bit width and reducing costs.

Figure 1:
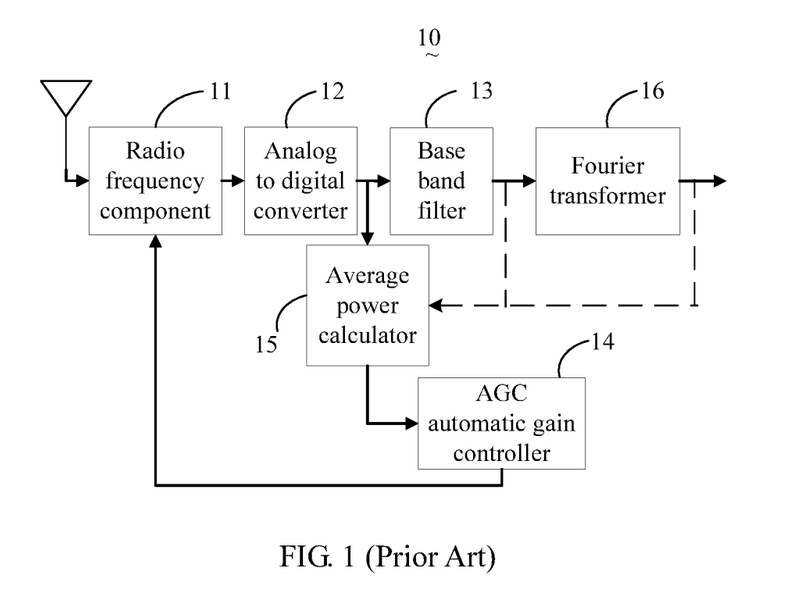
FIG. 1 is a schematic structural diagram of a radio frequency receiver in the prior art.
Figure 2:
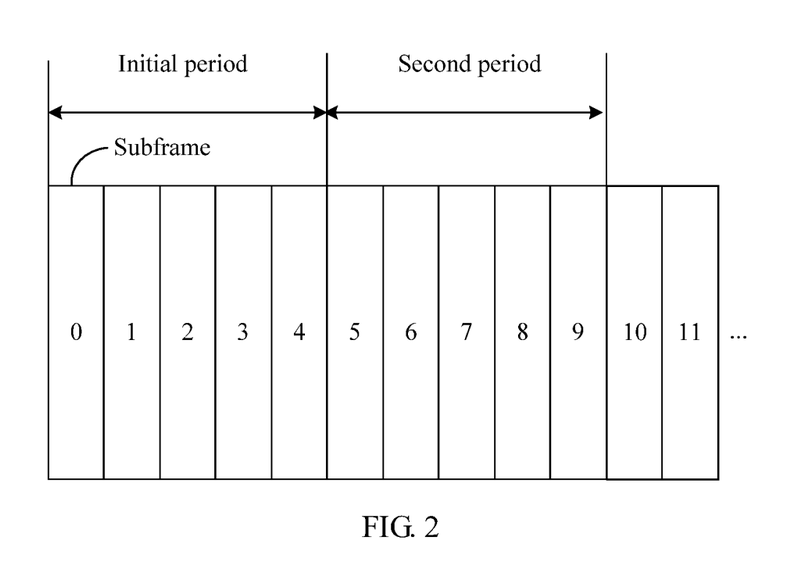
FIG. 2 is a schematic diagram of an AGC calculation period.

Referring to FIG. 1, FIG. 1 is a schematic structural diagram of a radio frequency receiver in the prior art. As shown in FIG. 1, an existing radio frequency receiver 10 includes a radio frequency component 11, an analog to digital converter 12, a base band filter 13, an AGC gain controller 14, an average power calculator 15, and a Fourier transformer 16. Further referring to FIG. 2, FIG. 2 is a schematic diagram of an AGC calculation period. As shown in FIG. 2, the AGC calculation period is 5 milliseconds (ms), which includes five subframes whose duration is 1 ms. The radio frequency receiver 10 in the prior art generally calculates an actual average power intensity in a period of time, for example, a calculation period, and further uses a difference between the actual average power intensity and a target average power intensity as a gain value of radio frequency data in a next calculation period, to perform an adjustment on an actual average power intensity of the radio frequency data in the next calculation period.

Calculation on the actual average power intensity are performed in the following manners:

Manner 1: The AGC gain controller 14 calculates, using the average power calculator 15, an actual average power intensity of the digital data before being filtered by the base band filter 13, and then adjusts a gain of the radio frequency component 11 on radio frequency data according to a calculation result, so as to ensure that components, such as the analog to digital converter 12, are unsaturated.

Manner 2: The average power calculator 15 is disposed at an output end of the base band filter 13 (refer to the dashed line in the figure), and the AGC gain controller 14 calculates, using the average power calculator 15, an actual average power intensity of digital data after being filtered by the base band filter 13, and then adjusts a gain of the radio frequency component 11 on radio frequency data, so as to ensure that a signal-to-noise ratio of radio frequency data that is quantized by an ADC is high.

Manner 3: The average power calculator 15 is disposed at an output end of the Fourier transformer 16 (refer to the dashed line in the figure), and the AGC gain controller 14 calculates an average power intensity of a cell reference signal resource element, which is energy that carries a cell-specific reference signal resource element (CRS RE) or an average power intensity of an effective subcarrier signal using the average power calculator 15, and then adjusts a gain of the radio frequency component 11 on radio frequency data according to a calculation result, so as to prevent dynamic changes, of signal time-domain power, that are brought by different scheduling in different periods.

In an actual application, in a coordinated multipoint (CoMP) scenario, transmission point (TP) switching causes a relatively large sudden change in wanted signal power (that is, actual average power) between subframes. In a heterogeneous network (HeNet) scenario, interference coordination of a macro base station or a micro base station also causes a relatively large sudden change in a level of interference between subframes. If calculating methods in the foregoing manners are used, it is required to use a calculation result of a previous calculation period in a next calculation period. If there is a great change in wanted signal power (or interference power) in a calculation period, a difference of the previous calculation period is directly used to adjust an actual average power intensity of the next calculation period. On one hand, a large difference adjustment easily leads to a mistake; on the other hand, an actual average power intensity in the previous calculation period cannot well reflect an actual average power intensity in the next calculation period due to an overlong calculation period. Therefore, an adjustment result may have a large deviation. For example, if an actual average power intensity of radio frequency data in a previous calculation period is 10 decibel (dB), and a target average power intensity is 20 dB, a gain value in a next calculation period is 10 dB. If there is a large difference between the actual average power intensity in the next calculation period and the actual average power intensity in the previous calculation period, for example, the actual average power intensity of the next calculation period is 20 dB, an improper adjustment occurs when the actual average power intensity in the next calculation period is adjusted by directly using the 10 dB gain value calculated in the previous calculation period. When the actual average power value in the next calculation period is much less than that in the previous calculation period, for example, the actual average power value in the next calculation period is 5 dB, the adjustment result is also improper. That is, an adjustment on a gain of radio frequency data in the next calculation period by directly using the difference calculated in the previous calculation period is a rough adjustment, an adjustment result does not meet a requirement, and it is required to perform multiple adjustments; therefore, saturation distortion of the radio frequency component is easily caused, or power of the radio frequency data is too low to reach a signal-to-noise ratio required for demodulation, thereby causing a higher bit error on the radio frequency receiver 10, and reducing a throughput.

SUMMARY

Embodiments of the present disclosure provide a radio frequency receiver and an automatic gain control method of the radio frequency receiver to mainly resolve a technical problem, which can quickly and accurately adjust a gain on radio frequency data when a relatively large change occurs in the radio frequency data, thereby ensuring that the radio frequency data is quickly and properly adjusted.

According to a first aspect, a radio frequency receiver is provided, where the radio frequency receiver includes an automatic gain control apparatus, a radio frequency component configured to receive radio frequency data and perform a gain adjustment on the radio frequency data, and an analog to digital converter configured to convert the radio frequency data obtained after the gain adjustment into digital data, where the automatic gain control apparatus further includes: an intensity calculator configured to calculate a relationship between an intensity representation parameter of the digital data and a preset intensity threshold within a preset calculation time, and an automatic gain controller configured to compare the relationship calculated by the intensity calculator with a preset relationship threshold to obtain a comparison result, and adjust a gain of the radio frequency component on the radio frequency data according to the comparison result, so that an amplitude of the radio frequency data obtained after the gain adjustment is within a receiving range of the analog to digital converter.

In a first possible implementation manner of the first aspect, the preset calculation time is less than a subframe period of the digital data, so that the automatic gain controller performs, in a latter-portion of a current subframe or in a fore-portion of a next subframe according to the comparison result, adjustment on a gain of the radio frequency component in the next subframe.

With reference to the first aspect or the first possible implementation manner of the first aspect, in a second possible implementation manner, the intensity representation parameter of the digital data is an amplitude intensity of the digital data, the intensity threshold is an amplitude intensity threshold, and the intensity calculator includes an amplitude intensity comparator and a counter, where the amplitude intensity comparator compares the amplitude intensity with the amplitude intensity threshold, and the counter is configured to calculate a quantity of times that the amplitude intensity of the digital data is greater than or equal to the amplitude intensity threshold within the calculation time, so as to reflect the relationship between the intensity representation parameter and the preset intensity threshold using the quantity of times.

With reference to the second possible implementation manner of the first aspect, in a third possible implementation manner, the relationship, calculated by the counter, between the intensity representation parameter and the preset intensity threshold is a ratio of the quantity of times that the amplitude intensity of the digital data is greater than or equal to the amplitude intensity threshold within the calculation time to a total quantity of times of comparison between the amplitude intensity of the digital data and the amplitude intensity threshold.

With reference to the third possible implementation manner of the first aspect, in a fourth possible implementation manner, the relationship threshold is a ratio threshold; and the automatic gain controller compares the ratio with the ratio threshold, if the ratio is less than or equal to the ratio threshold, increases the gain of the radio frequency component on the radio frequency data, and if the ratio is greater than the ratio threshold, maintains the gain of the radio frequency component on the radio frequency data.

With reference to the third possible implementation manner of the first aspect, in a fifth possible implementation manner, the relationship threshold is a ratio threshold; and the automatic gain controller compares the ratio with the ratio threshold, if the ratio is greater than or equal to the ratio threshold, decreases the gain of the radio frequency component on the radio frequency data, and if the ratio is less than the ratio threshold, maintains the gain of the radio frequency component on the radio frequency data.

With reference to the third possible implementation manner of the first aspect, in a sixth possible implementation manner, the relationship threshold is a ratio threshold, and the amplitude intensity threshold includes a first amplitude intensity threshold and a second amplitude intensity threshold, where the first amplitude intensity threshold is less than the second amplitude intensity threshold, and the ratio includes a first ratio and a second ratio, where the first amplitude intensity threshold corresponds to the first ratio, and the second amplitude intensity threshold corresponds to the second ratio; and the automatic gain controller separately compares the first ratio and the second ratio with the ratio threshold, where the first ratio is greater than the second ratio, if the first ratio is less than or equal to the ratio threshold, increases the gain of the radio frequency component on the radio frequency data, if the first ratio is greater than the ratio threshold and the second ratio is less than the ratio threshold, maintains the gain of the radio frequency component on the radio frequency data, and if the second ratio is greater than or equal to the ratio threshold, decreases the gain of the radio frequency component on the radio frequency data.

With reference to the first aspect or the first possible implementation manner of the first aspect, in a seventh possible implementation manner, the intensity representation parameter of the digital data is an actual average power intensity of the digital data within a preset period of time, and the intensity threshold is a target average power intensity, and the intensity calculator includes an average power calculator and a comparator, where the average power calculator calculates the actual average power intensity, and the comparator compares the actual average power intensity with the target average power intensity to obtain a difference.

With reference to the seventh possible implementation manner of the first aspect, in an eighth possible implementation manner, the relationship threshold is a difference threshold, which includes a first difference threshold and a second difference threshold that is less than the first difference threshold; and the automatic gain controller compares the difference with the first difference threshold and the second difference threshold, if the difference is greater than or equal to the first difference threshold, increases the gain of the radio frequency component on the radio frequency data, if the difference is less than or equal to the second difference threshold, decreases the gain of the radio frequency component on the radio frequency data, and if the difference is between the first difference threshold and the second difference threshold, maintains the gain of the radio frequency component on the radio frequency data.

With reference to the third possible implementation manner of the first aspect, in a ninth possible implementation manner, the relationship threshold is a ratio threshold, and the radio frequency receiver further includes an average power calculator, where the average power calculator is configured to calculate an actual average power intensity of the digital data within a preset period of time; and the automatic gain controller compares a target average power intensity with the actual average power intensity to obtain a difference, compares the difference with a first difference threshold and a second difference threshold, where the first difference threshold is greater than the second difference threshold, if the difference is greater than or equal to the first difference threshold, increases the gain of the radio frequency component on the radio frequency data, if the difference is less than or equal to the second difference threshold, decreases the gain of the radio frequency component on the radio frequency data, if the difference is between the first difference threshold and the second difference threshold, compares the ratio with the ratio threshold, if the ratio is greater than or equal to the ratio threshold, decreases or maintains the target average power intensity, and if the ratio is less than the ratio threshold, increases or maintains the target average power intensity.

With reference to any one of the seventh or the ninth possible implementation manners of the first aspect, in a tenth possible implementation manner, the radio frequency receiver further includes: a base band filter configured to filter the digital data, and a Fourier transformer that performs a Fourier transform on digital data that is filtered by the base band filter, where the average power calculator calculates, at an input end of the base band filter, or at an output end of the base band filter, or at the input end and the output end of the base band filter, or at an output end of the Fourier transformer, the actual average power intensity of the digital data.

With reference to the tenth possible implementation manner of the first aspect, in an eleventh possible implementation manner, the radio frequency receiver further includes a first digital gainer, a second digital gainer, and a direct current eliminator configured to eliminate a direct current component from the digital data, where the first digital gainer, coupled between the direct current eliminator and the base band filter, is configured to adjust an amplitude intensity of digital data that is obtained from eliminating the direct current component by the direct current eliminator, and the second digital gainer, coupled between the base band filter and the Fourier transformer, is configured to adjust an amplitude intensity of the digital data that is filtered by the base band filter. With reference to the second possible implementation manner of the first aspect, in a twelfth possible implementation manner, the radio frequency receiver further includes a direct current eliminator configured to eliminate a direct current component from the digital data, where the amplitude intensity comparator compares an amplitude intensity, which is acquired at an input end or an output end of the direct current eliminator, of the digital data with the amplitude intensity threshold.

With reference to the twelfth possible implementation manner of the first aspect, in a thirteenth possible implementation manner, the radio frequency receiver further includes a first digital gainer, a second digital gainer, a base band filter configured to filter the digital data, and a Fourier transformer that performs a Fourier transform on digital data that is filtered by the base band filter, where the first digital gainer, coupled between the direct current eliminator and the base band filter, is configured to adjust an amplitude intensity of digital data that is obtained from eliminating the direct current component by the direct current eliminator, and the second digital gainer, coupled between the base band filter and the Fourier transformer, is configured to adjust an amplitude intensity of the digital data that is filtered by the base band filter.

According to a second aspect, an automatic gain control method of a radio frequency receiver is provided, where the radio frequency receiver includes: a radio frequency component configured to receive radio frequency data and perform a gain adjustment on the radio frequency data, and an analog to digital converter configured to convert the radio frequency data obtained after the gain adjustment into digital data, where the method includes the following steps: calculating a relationship between an intensity representation parameter of the digital data and a preset intensity threshold within a preset calculation time, and comparing the calculated relationship with a preset relationship threshold to obtain a comparison result, and adjusting a gain of the radio frequency component on the radio frequency data according to the comparison result, so that an amplitude of the radio frequency data obtained after the gain adjustment is within a receiving range of the analog to digital converter.

In a first possible implementation manner of the second aspect, the preset calculation time is less than a subframe period of the digital data, so that an adjustment is performed, in a latter-portion of a current subframe or in a fore-portion of a next subframe according to the comparison result, on a gain of the radio frequency component in a next subframe.

With reference to the second aspect or the first possible implementation manner of the second aspect, in a second possible implementation manner, the intensity representation parameter of the digital data is an amplitude intensity of the digital data, and the intensity threshold is an amplitude intensity threshold, and the calculating a relationship between an intensity representation parameter of the digital data and a preset intensity threshold within a preset calculation time further includes: comparing the amplitude intensity with the amplitude intensity threshold, and calculating a quantity of times that the amplitude intensity of the digital data is greater than or equal to the amplitude intensity threshold, so as to reflect the relationship between the intensity representation parameter and the preset intensity threshold using the quantity of times.

With reference to the second possible implementation manner of the second aspect, in a third possible implementation manner, the relationship between the intensity representation parameter and the preset intensity threshold is a ratio of the quantity of times that the amplitude intensity of the digital data is greater than or equal to the amplitude intensity threshold within the calculation time to a total quantity of times of comparison between the amplitude intensity of the digital data and the amplitude intensity threshold.

With reference to the third possible implementation manner of the second aspect, in a fourth possible implementation manner, the relationship threshold is a ratio threshold, and the step of comparing the calculated relationship with a preset relationship threshold to obtain a comparison result, and adjusting a gain of the radio frequency component on the radio frequency data according to the comparison result further includes: comparing the ratio with the ratio threshold, if the ratio is less than or equal to the ratio threshold, increasing the gain of the radio frequency component on the radio frequency data, and if the ratio is greater than the ratio threshold, maintaining the gain of the radio frequency component on the radio frequency data.

With reference to the third possible implementation manner of the second aspect, in a fifth possible implementation manner, the relationship threshold is a ratio threshold, and the step of comparing the calculated relationship with a preset relationship threshold to obtain a comparison result, and adjusting a gain of the radio frequency component on the radio frequency data according to the comparison result further includes: comparing the ratio with the ratio threshold, if the ratio is greater than or equal to the ratio threshold, decreasing the gain of the radio frequency component on the radio frequency data, and if the ratio is less than the ratio threshold, maintaining the gain of the radio frequency component on the radio frequency data.

With reference to the third possible implementation manner of the second aspect, in a sixth possible implementation manner, the amplitude intensity threshold includes a first amplitude intensity threshold and a second amplitude intensity threshold, where the first amplitude intensity threshold is less than the second amplitude intensity threshold; the ratio includes a first ratio and a second ratio, where the first amplitude threshold corresponds to the first ratio, the second amplitude threshold corresponds to the second ratio, and the relationship threshold is a ratio threshold; and the step of comparing the calculated relationship with a preset relationship threshold, and adjusting a gain of the radio frequency component on the radio frequency data according to the comparison result further includes: separately comparing the first ratio and the second ratio with the ratio threshold, where the first ratio is greater than the second ratio, if the first ratio is less than or equal to the ratio threshold, increasing the gain of the radio frequency on the radio frequency data, if the first ratio is greater than the ratio threshold and the second ratio is less than the ratio threshold, maintaining the gain of the radio frequency component on the radio frequency data, and if the second ratio is greater than or equal to the ratio threshold, decreasing the gain of the radio frequency component on the radio frequency data.

With reference to the first or the second possible implementation manner of the second aspect, in a seventh possible implementation manner, the intensity representation parameter of the digital data is an actual average power intensity of the digital data within a preset period of time, and the intensity threshold is a target average power intensity; and the calculating a relationship between an intensity representation parameter of the digital data and a preset intensity threshold within a preset calculation time further includes: calculating the actual average power intensity; and comparing the actual average power intensity with the target average power intensity to obtain a difference.

With reference to the seventh possible implementation manner of the second aspect, in an eighth possible implementation manner, the relationship threshold is a difference threshold, which includes a first difference threshold and a second difference threshold that is less than the first difference threshold; and the step of comparing the calculated relationship with a preset relationship threshold to obtain a comparison result, and adjusting a gain of the radio frequency component on the radio frequency data according to the comparison result further includes: comparing the difference with the first difference threshold and the second difference threshold; if the difference is greater than or equal to the first difference threshold, increasing the gain of the radio frequency component on the radio frequency data; if the difference is less than or equal to the second difference threshold, decreasing the gain of the radio frequency component on the radio frequency data; and if the difference is between the first difference threshold and the second difference threshold, maintaining the gain of the radio frequency component on the radio frequency data.

With reference to the third possible implementation manner of the second aspect, in a ninth possible implementation manner, calculating an actual average power intensity of the digital data within a preset period of time, where the relationship threshold is a ratio threshold, and the step of comparing the calculated relationship with a preset relationship threshold to obtain a comparison result, and adjusting a gain of the radio frequency component on the radio frequency data according to the comparison result further includes: comparing a target average power intensity with the actual average power intensity to obtain a difference, comparing the difference with a first difference threshold and a second difference threshold, where the first difference threshold is greater than the second difference threshold; if the difference is greater than or equal to the first difference threshold, increasing the gain of the radio frequency component on the radio frequency data; if the difference is less than or equal to the second difference threshold, decreasing the gain of the radio frequency component on the radio frequency data; and if the difference is between the first difference threshold and the second difference threshold, comparing the ratio with the ratio threshold; if the ratio is greater than or equal to the ratio threshold, decreasing or maintaining the target average power intensity; and if the ratio is less than the ratio threshold, increasing or maintaining the target average power intensity.

With reference to any one of the seventh or the ninth possible implementation manner of the second aspect, in a tenth possible implementation manner, the radio frequency receiver further includes: a base band filter configured to filter the digital data; and a Fourier transformer configured to perform a Fourier transform on digital data that is filtered by the base band filter, where the step of calculating an actual average power intensity of the digital data further includes: calculating the actual average power intensity of the digital data at an input end of the base band filter, or at an output end of the base band filter, or at the input end and the output end of the base band filter, or at an output end of the Fourier transformer.

With reference to the first possible implementation manner of the second aspect, in an eleventh possible implementation manner, the radio frequency receiver further includes a direct current eliminator configured to eliminate a direct current component from the digital data, where the step of comparing the amplitude intensity of the digital data with the amplitude intensity threshold further includes: comparing an amplitude intensity of the digital data acquired at an input end or an output end of the direct current eliminator with the amplitude intensity threshold.

Beneficial effects of the embodiments of the present disclosure are as follows: Different from a situation in the prior art, in the embodiments of the present disclosure, an automatic gain control apparatus of a radio frequency receiver calculates a relationship between an intensity representation parameter of digital data and a preset intensity threshold within a preset calculation time, further compares the calculated relationship with a preset relationship threshold to obtain a comparison result, and then adjusts, according to the comparison result, a gain of a radio frequency component on radio frequency data, so that an amplitude of the radio frequency data obtained after the gain adjustment is within a receiving range of an analog to digital converter. In this way, a gain can be adjusted in a more accurate and timely manner according to a change of the radio frequency data, ensuring to the most extent that data is adjusted properly.

DESCRIPTION OF EMBODIMENTS

To make the objectives, technical solutions, and advantages of the embodiments of the present disclosure clearer, the following clearly describes the technical solutions in the embodiments of the present disclosure with reference to the accompanying drawings in the embodiments of the present disclosure. The described embodiments are some but not all of the embodiments of the present disclosure. All other embodiments obtained by a person of ordinary skill in the art based on the embodiments of the present disclosure without creative efforts shall fall within the protection scope of the present disclosure.

Figure 3:
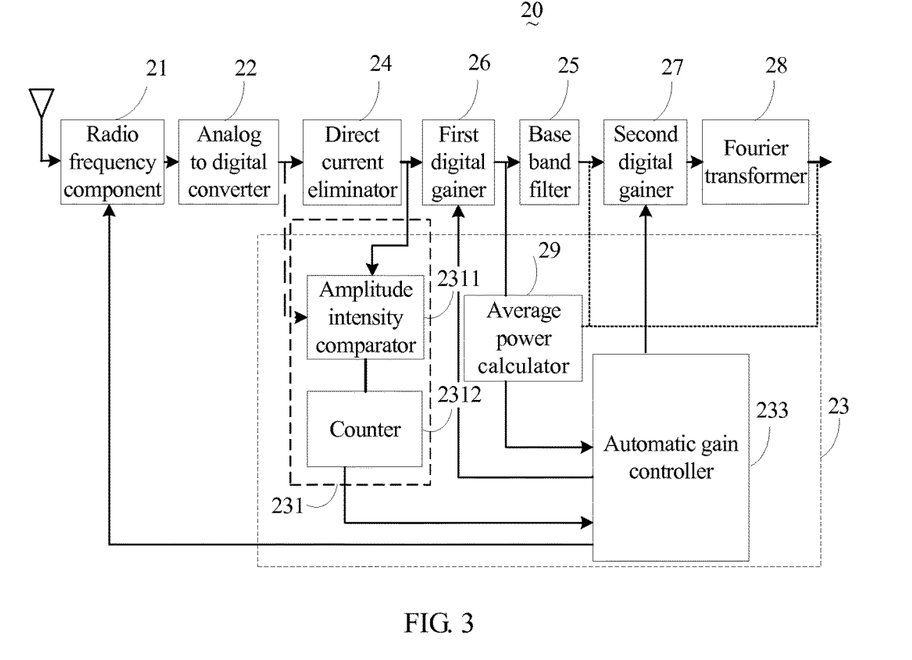
FIG. 3 is a schematic structural diagram of a radio frequency receiver according to an embodiment of the present disclosure.

Referring to FIG. 3, FIG. 3 is a schematic structural diagram of a radio frequency receiver according to an embodiment of the present disclosure. As shown in FIG. 3, a radio frequency receiver 20 includes a radio frequency component 21, an analog to digital converter 22, an automatic gain control apparatus 23, a filter 25, a Fourier transformer 28, and an average power calculator 29; where the radio frequency component 21 is configured to receive radio frequency data, and perform a gain adjustment on the radio frequency data; the analog to digital converter 22 is configured to convert the radio frequency data obtained after the gain adjustment into digital data.

The automatic gain control apparatus 23 further includes an intensity calculator 231 and an automatic gain controller 233. Further referring to FIG. 2, the radio frequency receiver 20 in this embodiment of the present disclosure first calculates, at an input end or an output end (refer to the dashed line in the figure) of the base band filter 25, or at an output end (refer to the dashed line in the figure) of the Fourier transformer 28, an actual average power intensity of digital data in an initial calculation period (0 to 4 subframes) using the average power calculator 29; and then the automatic gain controller 233 compares the actual average power intensity with a target average power intensity to obtain a difference, and when a next calculation period begins, first adjusts a gain of the radio frequency component 21 on the radio frequency data according to the difference obtained in the initial calculation period, and then calculates an intensity representation parameter of digital data after the gain adjustment and analog to digital conversion. For example, in the first subframe in the next calculation period, for example, the fifth subframe shown in FIG. 2, the gain of the radio frequency component 21 on the radio frequency data is adjusted according to the difference obtained in the initial calculation period. From a next subframe, for example, in the sixth subframe shown in FIG. 2, an intensity representation parameter of digital data in the fifth subframe are calculated; in the seventh subframe, an intensity representation parameter of digital data in the sixth subframe are calculated; and so on. Specific calculation on an intensity representation parameter of digital data is that: the intensity calculator 231 calculates a relationship between an intensity representation parameter of digital data and a preset intensity threshold within a preset calculation time. The automatic gain controller 233 compares the relationship calculated by the intensity calculator 231 with the preset relationship threshold to obtain a comparison result, and adjusts the gain of the radio frequency component 21 on the radio frequency data according to the comparison result, so that an amplitude of the radio frequency data obtained after the gain adjustment is within a receiving range of the analog to digital converter 22.

A longer preset calculation time results in a better adjustment effect; however, the preset calculation time is generally shorter than a subframe period of digital data. For example, a subframe period shown in FIG. 2 is 1 ms; therefore, the preset calculation time is shorter than 1 ms, so that the automatic gain controller 233 adjusts, in a latter-portion of a current subframe or in a fore-portion of a next subframe according to the comparison result, a gain of the radio frequency component 21 in the next subframe.

Therefore, in this embodiment, when a change of data is relatively large, the intensity calculator 231 can learn the change in the latter-portion of the current subframe or in the fore-portion of the next subframe, so that an adjustment can be quickly performed. Further, within each calculation time, calculation is performed on the relationship between the intensity representation parameter of the digital data and the intensity threshold, and the relationship is further compared with the relationship threshold, so that a fine adjustment can be performed on the gain. Compared with a solution in the prior art that a gain is roughly adjusted by directly using a difference calculated, adjustment accuracy in the present application is higher.

Optionally, the intensity representation parameter of the digital data is an amplitude intensity of the digital data, the intensity threshold is an amplitude intensity threshold, and the intensity calculator 231 includes an amplitude intensity comparator 2311 and a counter 2312. The amplitude intensity comparator 2311 compares the amplitude intensity with the amplitude intensity threshold, and the counter 2312 calculates a quantity of times that the amplitude intensity of the digital data is greater than or equal to the amplitude intensity threshold within the calculation time, so as to reflect the relationship between the intensity representation parameter and the preset intensity threshold using the quantity of times. The relationship may be represented by a ratio, that is, the relationship, calculated by the counter 2312, between the intensity representation parameter and the preset intensity threshold is a ratio of the quantity of times that the amplitude intensity of the digital data is greater than or equal to the amplitude intensity threshold within the calculation time to a total quantity of times of comparison between the amplitude intensity of the digital data and the amplitude intensity threshold.

An amplitude intensity threshold is preset, the amplitude intensity comparator 2311 compares the amplitude intensity of the digital data with the amplitude intensity threshold, and when the amplitude intensity of the digital data is greater than or equal to the amplitude intensity threshold, accumulating by 1. After the amplitude intensity of the digital data is compared within the preset calculation time, the quantity of times that the amplitude intensity of the digital data is greater than or equal to the amplitude intensity threshold is sent to the counter 2312, and the counter 2312 calculates the ratio of the quantity of times to the total quantity of times. The automatic gain controller 233 further adjusts the radio frequency data using the ratio, where in this embodiment, the relationship threshold is a ratio threshold. There may be three following adjustment methods:

Method 1: The automatic gain controller 233 compares the ratio with a preset ratio threshold, if the ratio is greater than or equal to the ratio threshold, decreases the gain of the radio frequency component 21 on the radio frequency data;

and if the ratio is less than the ratio threshold, maintains the gain of the radio frequency component 21 on the radio frequency signal.

Method 2: The automatic gain controller 233 compares the ratio with the preset ratio threshold, if the ratio is less than or equal to the ratio threshold, increases the gain of the radio frequency component 21 on the radio frequency data, and if the ratio is greater than the ratio threshold, maintains the gain of the radio frequency component on the radio frequency data.

Settings of the amplitude intensity thresholds in the first method and the second method are related to bit width of the analog to digital converter 22 and an average bit quantity corresponding to the target average power intensity. For example, if the bit width of the analog to digital converter 22 is 12 bits (bits), and the average bit quantity corresponding to the target average power intensity is 6 bits, the amplitude intensity threshold may be set to $2^8$ to $2^{10}$ in the first method. That is, an exponent set in the amplitude intensity threshold is greater than the average bit quantity corresponding to the target average power intensity, and is less than the bit width of the analog to digital converter 22 by 2 to 4 bits. In the second method, the amplitude intensity threshold may be set to $2^6$ to $2^7$. That is, an exponent of 2 set in the amplitude intensity threshold is greater than or equal to the average bit quantity corresponding to the target average power intensity, and is less than the bit width of the analog to digital converter 22 by 5 to 6 bits.

Method 3: There are at least two amplitude intensity comparators 2311 and at least two counters 2312, which correspond to each other one-to-one, and detailed description is performed in this embodiment using an example in which there are two amplitude intensity comparators 2311 and two counters 2312. The amplitude intensity threshold includes a first amplitude intensity threshold and a second amplitude intensity threshold, where the first amplitude intensity threshold is less than the second amplitude intensity threshold. The two amplitude intensity comparators 2311 separately compare the amplitude intensity of the digital data with the first amplitude intensity threshold and the second amplitude intensity threshold, and two counters 2312 separately calculates a first ratio and a second ratio according to results obtained by comparison by the amplitude intensity comparators 2311, that is, the first amplitude intensity threshold corresponds to the first ratio, and the second amplitude intensity threshold corresponds to the second ratio. Because the first amplitude intensity threshold is less than the second amplitude intensity threshold, the first ratio is greater than the second ratio. The automatic gain controller 233 separately compares the received first ratio and the received second ratio with the ratio threshold, if the first ratio is less than or equal to the ratio threshold, increases the gain of the radio frequency component 21 on the radio frequency signal, if the first ratio is greater than the ratio threshold, and the second ratio is less than the ratio threshold, maintains the gain of the radio frequency component 21 on the radio frequency signal, and if the second ratio is greater than or equal to the ratio threshold, decreases the gain of the radio frequency component 21 on the radio frequency signal. This method improves adjustment and control accuracy of the automatic gain controller 233.

Settings of the first amplitude intensity threshold and the second amplitude intensity threshold in the third method are respectively the same as the settings of the amplitude intensity threshold in the second method and the first method described above. Details are not described herein again.

When there are more than two amplitude intensity comparators 2311 and counters 2312 respectively, working principles of the amplitude intensity comparator 2311, the counter 2312, and the automatic gain controller 233 are the same as those in the third method, and details are not described herein again.

Therefore, the automatic gain controller 233 of the radio frequency receiver 20 in this embodiment of the present disclosure compares a result obtained by the counter 2312 by calculation with the ratio threshold to determine whether to adjust a gain in a next subframe, and if a gain is to be adjusted in the next subframe, the adjustment can be performed in the next subframe in time, so that it can be ensured that the radio frequency data is quickly and properly adjusted within an adjustment period. Further, in this embodiment of the present disclosure, the ratio of the quantity of times that the amplitude intensity of the digital data is greater than or equal to the amplitude intensity threshold to the total quantity of times of comparison between the amplitude intensity of the digital data and the amplitude intensity threshold is compared with the ratio threshold, and the gain on the radio frequency data is adjusted according to the comparison result so as to perform a fine adjustment on the gain; in this way, an adjustment result is more accurate, thereby avoiding a problem of data phase discontinuity caused by frequent gain switching resulted from a relatively large deviation in the adjustment result in the prior art.

The automatic gain controller 233 of the radio frequency receiver 20 may further determine whether to adjust the target average power value using the three methods described above, and if the target average power value is to be adjusted, the adjustment is performed in a next period.

Optionally, the radio frequency receiver 20 further includes a direct current eliminator 24 configured to eliminate a direct current component from the digital data. The amplitude intensity comparator 2311 compares an amplitude intensity of the digital data acquired at an input end (refer to the dashed line in the figure) or an output end of the direct current eliminator 24 with the amplitude intensity threshold.

Optionally, the radio frequency receiver 20 further includes a first digital gainer 26 and a second digital gainer 27. The first digital gainer 26 is coupled between the direct current eliminator 24 and the base band filter 25, and the second digital gainer 27 is coupled between the base band filter 25 and the Fourier transformer 28.

Because a gain granularity between gains is relatively large, and a maximum gain on the digital data is limited, after the direct current component is eliminated from the amplitude intensity of the digital data by the direct current eliminator 24, the automatic gain controller 233 controls, according to the result obtained by the counter 2312 by calculation, the first digital gainer 26 to dynamically adjust the amplitude intensity of the digital data. Further, in an interference scenario of a narrow band or adjacent channel selectivity (ACS) or the like, a relatively large decrease may occur in power of the digital data that is filtered by the base band filter 25; therefore, in the interference scenario of a narrow band or ACS, the automatic gain controller 233 further controls, according to the result obtained by the counter 2312 by calculation, the second digital gainer 27 to adjust an amplitude intensity of the digital data that is filtered by the base band filter 25, so that the digital data is more suitable for the Fourier transformer 28 to perform a Fourier transform.

The present disclosure further provides another embodiment based on the radio frequency receiver 20 described above, that is, the automatic gain controller 233 of the radio frequency receiver 20 adjusts the gain of the radio frequency component 21 on the radio frequency data with reference to results calculated by the amplitude intensity comparator 2311 and the counter 2312 and the actual average power intensity calculated by the average power calculator 29.

Similar to the calculation on the amplitude intensity of the radio frequency data described above, in this embodiment of the present disclosure, at a beginning of the second calculation period, the gain of the radio frequency component 21 on the radio frequency data is first adjusted according to the difference between the actual average power intensity calculated in the initial calculation period and the target average power intensity, and then calculation is performed on an amplitude intensity and an actual average power intensity of the radio frequency data after the gain adjustment. For example, in the first subframe in the second calculation period, for example, the fifth subframe shown in FIG. 2, the gain of the radio frequency component 21 on the radio frequency data is adjusted according to the difference calculated in the initial calculation period. From a next subframe, for example, in the sixth subframe shown in FIG. 2, calculation on an amplitude intensity and an actual average power intensity of radio frequency data in the fifth subframe is performed; in the seventh subframe, calculation on an amplitude intensity and an actual average power intensity of radio frequency data in the sixth subframe is performed; and so on.

The average power calculator 29 calculates an actual average power intensity of digital data at the input end of the base band filter 25 within a preset period of time. The automatic gain controller 233 compares the target average power intensity with the actual average power intensity to obtain a difference, for example, it is assumed that the target average power intensity is Target, the actual average power intensity is PreRSSI, and the difference is delta, and the following relationship exists:

delta=Target−PreRSSI

Further, the automatic gain controller 233 compares the difference delta with a first difference threshold and a second difference threshold, where the first difference threshold is greater than the second difference threshold, and the first difference and the second difference are preferably opposite numbers. For example, the first difference threshold is Threshold, and the second difference threshold is −Threshold. Then, an adjustment is performed on the radio frequency data according to a comparison result, which is classified into the following situations:

Situation 1: If the difference is greater than or equal to the first difference threshold, that is, delta>=Threshold, the gain of the radio frequency component 21 on the radio frequency data is increased.

Situation 2: If the difference is less than or equal to the second difference threshold, that is, delta=<−Threshold, the gain of the radio frequency component 21 on the radio frequency data is decreased.

Situation 3: If the difference is between the first difference threshold and the second difference threshold, that is, −Threshold<delta<Threshold, the ratio calculated by the amplitude intensity comparator 2311 and the counter 2312 is compared with the ratio threshold.

If the ratio is greater than or equal to the ratio threshold, the target average power intensity is decreased or maintained; and if the ratio is less than the ratio threshold, the target average power intensity is increased or maintained.

It should be noted that, adjustments on the radio frequency data in the first situation and the second situation mentioned above are both performed in a next subframe. An adjustment on the target average power intensity in the third situation is performed in a next calculation period.

In other optional implementation, the average power calculator 29 may further calculate an actual average power intensity of digital data at the output end of the base band filter 25, or calculate an actual average power intensity of digital data at the input end and the output end of the base band filter 25, or calculate an actual average power intensity of digital data at the output end of the Fourier transformer 28.

When the average power calculator 29 calculates the actual average power intensity of the digital data at the output end of the Fourier transformer 28, calculation is performed on an actual average power intensity of a CRS RE or on an actual average power intensity of an effective subcarrier signal.

The digital data at the input end and the output end of the base band filter 25 belongs to a time-domain signal, and the CRS RE and the effective subcarrier signal belong to a frequency domain signal.

It should be noted that, when the average power calculator 29 calculates the actual average power intensity of the digital data in different positions, the first difference threshold and the second difference threshold need to be set according to an actual situation. Further, a relationship between the first difference threshold and the second difference threshold may also be set to others.

Therefore, in this embodiment, an automatic gain controller 233 compares a difference between an actual average power intensity and a target average power intensity with a difference threshold, and further controls, with reference to an actual average power intensity and an amplitude intensity, the radio frequency component 21 to adjust radio frequency data, so that an adjustment result is more accurate, thereby avoiding a problem of data phase discontinuity caused by frequent gain switching resulted from a relatively large deviation in the adjustment result.

Figure 4:
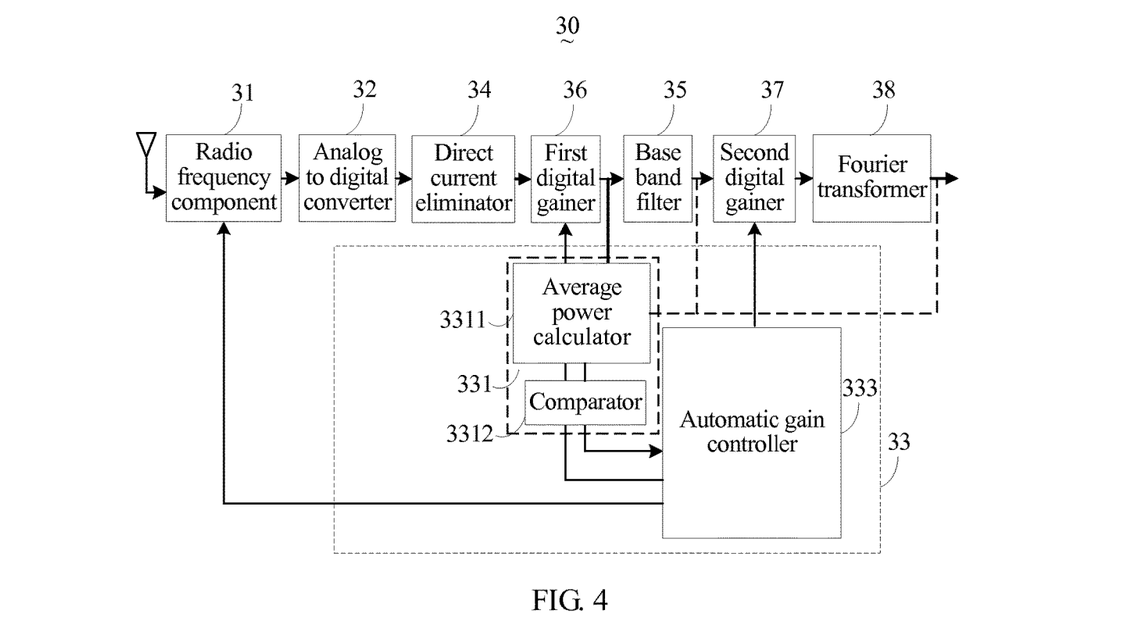
FIG. 4 is another schematic structural diagram of a radio frequency receiver according to an embodiment of the present disclosure.

To reduce costs and simplify a calculation process, the present disclosure further provides another radio frequency receiver; for details, refer to FIG. 4. FIG. 4 is another schematic structural diagram of a radio frequency receiver according to an embodiment of the present disclosure. As shown in FIG. 4, a radio frequency receiver 30 in this embodiment still includes a radio frequency component 31, an analog to digital converter 32, an automatic gain control apparatus 33, a direct current eliminator 34, a base band filter 35, a first digital gainer 36, a second digital gainer 37, and a Fourier transformer 38. The automatic gain control apparatus 33 still includes an intensity calculator 331 and an automatic gain controller 333. Working principles of the radio frequency component 31, the analog to digital converter 32, the direct current eliminator 34, the base band filter 35, the first digital gainer 36, the second digital gainer 37, and the Fourier transformer 38 are the same as those of the corresponding components described above, and details are not described herein again.

A difference between the radio frequency receiver 30 in this embodiment and the radio frequency receiver 20 in the embodiment described above lies in that: in this embodiment, an intensity representation parameter of digital data is an actual average power intensity of the digital data within a preset period of time, an intensity threshold is a target average power intensity, and a relationship threshold is a difference threshold, which includes a first difference threshold and a second difference threshold that is less than the first difference threshold.

In this embodiment, the intensity calculator 331 includes an average power calculator 3311 and a comparator 3312, where the average power calculator 3311 calculates the actual average power intensity of the digital data, and the comparator 3312 compares the actual average power intensity with the target average power intensity to obtain a difference. The automatic gain controller 333 compares the difference with the first difference threshold and the second difference threshold, if the difference is greater than or equal to the first difference threshold, increases a gain of the radio frequency component 31 on radio frequency data, if the difference is less than or equal to the second difference threshold, decreases the gain of the radio frequency component 31 on the radio frequency data, and if the difference is between the first difference threshold and the second difference threshold, maintains the gain of the radio frequency component 31 on the radio frequency data.

Similarly, in this embodiment, calculation is performed on an actual average power intensity of digital data at an input end or an output end of the base band filter 35 or at an output end of the Fourier transformer 38.

In this embodiment, similarly, the actual average power intensity is first compared with the target average power intensity to obtain a difference between the two, and then the difference is compared with the difference threshold, so as to obtain a more accurate adjustment result.

Figure 5:
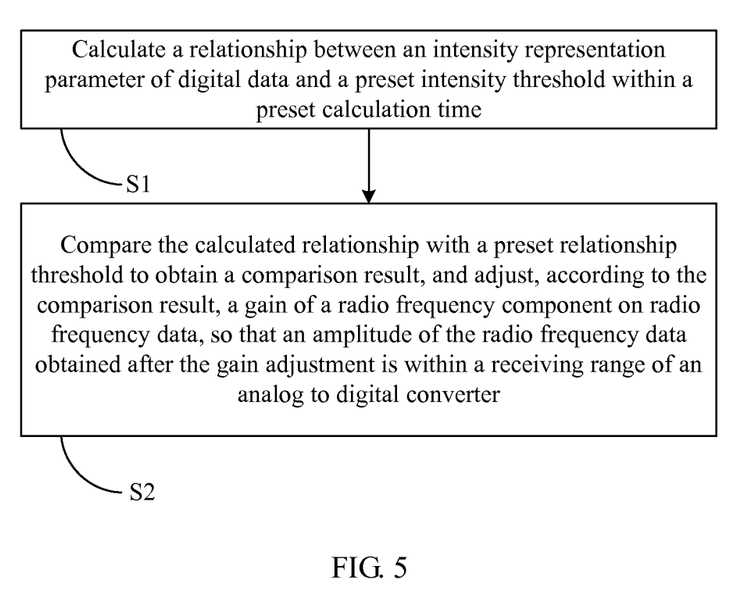
FIG. 5 is a flowchart of an automatic gain control method of a radio frequency receiver according to an embodiment of the present disclosure.

An embodiment of the present disclosure further provides an automatic gain control method of a radio frequency receiver based on the radio frequency receiver described above; for details, refer to FIG. 5. FIG. 5 is an automatic gain control method of a radio frequency receiver according to an embodiment of the present disclosure. The method includes the following steps:

Step S1: Calculate a relationship between an intensity representation parameter of digital data and a preset intensity threshold within a preset calculation time.

Step S2: Compare the calculated relationship with a preset relationship threshold to obtain a comparison result, and adjust, according to the comparison result, a gain of a radio frequency component on radio frequency data, so that an amplitude of the radio frequency data obtained after the gain adjustment is within a receiving range of an analog to digital converter.

The preset calculation time is less than a subframe period of the digital data, for example, the subframe period is 1 ms, as shown in FIG. 2; therefore, the preset calculation time is less than 1 ms, so that an adjustment is performed, in a latter-portion of a current subframe or in a fore-portion of a next subframe according to the comparison result, the gain of the radio frequency component in the next subframe.

Therefore, in this embodiment, when there is a relatively large change in data, the change can be learned in the latter-portion of the current subframe or in the fore-portion of the next subframe, so that an adjustment can be quickly performed. Further, within each calculation time, calculation is performed on the relationship between the intensity representation parameter of the digital data and the intensity threshold, and the relationship is further compared with the relationship threshold, so that a fine adjustment can be performed on the gain. Compared with a solution in the prior art that a gain is roughly adjusted by directly using a difference calculated, adjustment accuracy in the present application is higher.

Optionally, the intensity representation parameter of the digital data is an amplitude intensity of the digital data, and the intensity threshold is an amplitude intensity threshold; in this case, step S1 may further include comparing the amplitude intensity with the amplitude intensity threshold; and calculating a quantity of times that the amplitude intensity of the digital data is greater than or equal to the amplitude intensity threshold within the calculation time, so as to reflect the relationship between the intensity representation parameter and the preset intensity threshold using the quantity of times. The relationship may be represented by a ratio, that is, a ratio of the quantity of times that the amplitude intensity of the digital data is greater than or equal to the amplitude intensity threshold within the calculation time to a total quantity of times of comparison between the amplitude intensity of the digital data and the amplitude intensity threshold. A specific process is as described above, and details are not described herein again.

This step includes comparing an amplitude intensity of digital data acquired at an input end or an output end of a direct current eliminator with the amplitude intensity threshold.

In step S2, the relationship obtained in step S1 by calculation is compared with the preset relationship threshold to obtain a comparison result, and the gain of the radio frequency component on the radio frequency data is adjusted according to the comparison result, where the relationship threshold is a ratio threshold, and the following three methods are included.

Method 1: The ratio is compared with the ratio threshold; where if the ratio is greater than or equal to the ratio threshold, the gain of the radio frequency component on the radio frequency data is decreased; and if the ratio is less than the ratio threshold, the gain of the radio frequency component on the radio frequency data is maintained.

Method 2: The ratio is compared with the ratio threshold; where if the ratio is less than or equal to the ratio threshold, the gain of the radio frequency component on the radio frequency data is increased; and if the ratio is greater than the ratio threshold, the gain of the radio frequency component on the radio frequency data is maintained.

Settings of the ratio thresholds in the first method and the second method are described above, and details are not described herein again.

Method 3: The amplitude intensity threshold includes a first amplitude intensity threshold and a second amplitude intensity threshold, where the first amplitude intensity threshold is less than the second amplitude intensity threshold, and the ratio includes a first ratio and a second ratio; first, a result of comparison between the digital data and the first amplitude intensity threshold is the first ratio, and a result of comparison between the digital data and the second amplitude intensity threshold is the second ratio, that is, the first amplitude intensity threshold corresponds to the first ratio, and the second amplitude intensity threshold corresponds to the second ratio; because the first amplitude intensity threshold is less than the second amplitude intensity threshold, the first ratio is greater than the second ratio; and the first ratio and the second ratio are separately compared with the ratio threshold; where if the first ratio is less than or equal to the ratio threshold, the gain of the radio frequency component on the radio frequency data is increased; if the first ratio is greater than the ratio threshold, and the second ratio is less than the ratio threshold, the gain of the radio frequency component on the radio frequency data is maintained; and if the second ratio is greater than or equal to the ratio threshold, the gain of the radio frequency component on the radio frequency data is decreased.

Settings of the first amplitude intensity threshold and the second amplitude intensity threshold are as described above, and details are not described herein again.

Optionally, the method in this embodiment further includes calculating an actual average power intensity of the digital data within a preset period of time, which in this embodiment, is calculating an actual average power value of digital data at an input end of a base band filter. Then, step S2 may further include calculating a difference between a target average power value and the actual average power value, and comparing the difference with the first difference threshold and the second difference threshold, where the first difference threshold is greater than the second difference threshold, and the first difference threshold and the second difference threshold are preferably opposite numbers; if the difference is greater than or equal to the first difference threshold, increasing the gain of the radio frequency component on the radio frequency data; if the difference is less than or equal to the second difference threshold, decreasing the gain of the radio frequency component on the radio frequency data; if the difference is between the first difference threshold and the second difference threshold, comparing the ratio calculated in step S1 with the ratio threshold; if the ratio is greater than or equal to the ratio threshold, decreasing or maintaining the target average power intensity; and if the ratio is less than the ratio threshold, increasing or maintaining the target average power intensity.

It should be noted that, adjustments on the gain on the radio frequency data described above are performed in a next subframe. An adjustment on the target average power intensity is performed in a next calculation period.

In another optional embodiment, calculation on an actual average power intensity of the digital data may further be performed at an output end of the base band filter or at the input end and the output end of the base band filter.

In another optional embodiment, calculation on an actual average power intensity of the digital data may further be performed at an output end of a Fourier transformer. To calculate the actual average power intensity of the digital data at the output end of the Fourier transformer, calculation is performed on an actual average power intensity of a CRS RE or an actual average power intensity of an effective subcarrier signal.

The digital data at the input end and the output end of the base band filter 25 belongs to a time-domain signal, and the CRS RE and the effective subcarrier signal belong to a frequency domain signal.

In conclusion, the foregoing method is an automatic gain control method used when the intensity representation parameter of the digital data is the amplitude intensity of the digital data, the intensity threshold is the amplitude intensity threshold, and the relationship threshold is the ratio threshold. An embodiment of the present disclosure further provides another automatic gain control method, that is, the intensity representation parameter of the digital data is an actual average power intensity of the digital data within a preset period of time, the intensity threshold is a target average power intensity, and the relationship threshold is a difference threshold, which includes a first difference threshold and a second difference threshold that is less than the first difference threshold. Therefore, step S1 described above may be include calculating the actual average power intensity of the digital data; and comparing the actual average power intensity with the target average power intensity to obtain a difference.

Step S2 described above may include comparing the difference with the first difference threshold and the second difference threshold; where if the difference is greater than or equal to the first difference threshold, increasing the gain of the radio frequency component on the radio frequency data; if the difference is less than or equal to the second difference threshold, decreasing the gain of the radio frequency component on the radio frequency data; and if the difference is between the first difference threshold and the second difference threshold, maintaining the gain of the radio frequency component on the radio frequency data.

In conclusion, a radio frequency receiver in this embodiment of the present disclosure calculates a relationship between an intensity representation parameter of digital data and an intensity threshold, and further compares the relationship with a relationship threshold, so that a fine adjustment can be performed on a gain. In this way, the radio frequency receiver in the present disclosure can adjust radio frequency data in a next subframe in time when a relatively large change occurs in the radio frequency data, which can ensure that the radio frequency data is quickly and properly adjusted within an adjustment period, thereby avoiding a problem of data phase discontinuity caused by frequent gain switching resulted from a relatively large deviation in an adjustment result.

Further, when the intensity representation parameter is the amplitude intensity of the digital data, the gain on the radio frequency data or target average power is further adjusted with reference to the actual average power intensity, so that the adjustment result is more accurate.

The foregoing descriptions are merely the embodiments of the present disclosure, and the protection scope of the present disclosure is not limited thereto. All equivalent structure or process changes made according to the content of this specification and accompanying drawings in the present disclosure or by directly or indirectly applying the present disclosure in other related technical fields shall fall within the protection scope of the present disclosure.

What is claimed is:

1. A radio frequency receiver comprising:
   an automatic gain control apparatus;
   a radio frequency component configured to receive radio frequency data and perform a gain adjustment on the radio frequency data; and
   an analog to digital converter configured to convert the radio frequency data obtained after the gain adjustment into digital data, wherein the automatic gain control apparatus further comprises:
      an intensity calculator configured to calculate a relationship between an intensity representation parameter of the digital data and a preset intensity threshold within a preset calculation time; and
      an automatic gain controller configured to compare the relationship calculated by the intensity calculator with a preset relationship threshold to obtain a comparison result, and adjust a gain of the radio frequency component on the radio frequency data according to the comparison result, so that an amplitude of the radio frequency data obtained after the gain adjustment is within a receiving range of the analog to digital converter,
   wherein the preset calculation time is less than a subframe period of the digital data, so that the automatic gain controller performs, in a latter-portion of a current subframe or in a fore-portion of a next subframe according to the comparison result, an adjustment on a gain of the radio frequency component in the next subframe, wherein the intensity calculator comprises an intensity comparator and a counter, wherein the intensity comparator compares the intensity representation parameter with the preset intensity threshold, wherein the counter is configured to calculate a quantity of times that the intensity representation parameter of the digital data is greater than or equal to the preset intensity threshold within the preset calculation time, so as to reflect the relationship between the intensity representation parameter and the present intensity threshold by using the quantity of times, and wherein the relationship, calculated by the counter, between the intensity representation parameter and the preset intensity threshold is a ratio of the quantity of times that the intensity representation parameter of the digital data is greater than or equal to the preset intensity threshold within the preset calculation time to a total quantity of times of comparison between the intensity representation parameter of the digital data and the preset intensity threshold.

2. The radio frequency receiver according to claim 1, wherein the intensity representation parameter of the digital data is an amplitude intensity of the digital data, wherein the preset intensity threshold is an amplitude intensity threshold, wherein the intensity comparator is an amplitude intensity comparator, wherein the amplitude intensity comparator compares the amplitude intensity with the amplitude intensity threshold, and wherein the counter is configured to calculate a quantity of times that the amplitude intensity of the digital data is greater than or equal to the amplitude intensity threshold within the preset calculation time, so as to reflect the relationship between the intensity representation parameter and the preset intensity threshold by using the quantity of times.

3. The radio frequency receiver according to claim 2, wherein the ratio is a ratio of the quantity of times that the amplitude intensity of the digital data is greater than or equal to the amplitude intensity threshold within the preset calculation time to a total quantity of times of comparison between the amplitude intensity of the digital data and the amplitude intensity threshold.

4. The radio frequency receiver according to claim 3, wherein the preset relationship threshold is a ratio threshold, and wherein the automatic gain controller compares the ratio with the ratio threshold, and wherein the radio frequency component is configured to:
increase the gain of the radio frequency component on the radio frequency data when the ratio is less than or equal to the ratio threshold; and
maintain the gain of the radio frequency component on the radio frequency data when the ratio is greater than the ratio threshold.

5. The radio frequency receiver according to claim 3, wherein the preset relationship threshold is a ratio threshold, and wherein the automatic gain controller compares the ratio with the ratio threshold, and wherein the radio frequency component is configured to:
decrease the gain of the radio frequency component on the radio frequency data when the ratio is greater than or equal to the ratio threshold; and
maintain the gain of the radio frequency component on the radio frequency data when the ratio is less than the ratio threshold.

6. The radio frequency receiver according to claim 3, wherein the preset relationship threshold is a ratio threshold, and wherein the amplitude intensity threshold comprises a first amplitude intensity threshold and a second amplitude intensity threshold, wherein the first amplitude intensity threshold is less than the second amplitude intensity threshold, and the ratio comprises a first ratio and a second ratio, wherein the first amplitude intensity threshold corresponds to the first ratio, and the second amplitude intensity threshold corresponds to the second ratio, wherein the automatic gain controller separately compares the first ratio and the second ratio with the ratio threshold, wherein the first ratio is greater than the second ratio, wherein the gain of the radio frequency component on the radio frequency data is increased when the first ratio is less than or equal to the ratio threshold, wherein the gain of the radio frequency component on the radio frequency data is maintained when the first ratio is greater than the ratio threshold and the second ratio is less than the ratio threshold, and wherein the gain of the radio frequency component on the radio frequency data is decreased when the second ratio is greater than or equal to the ratio threshold.

7. The radio frequency receiver according to claim 1, wherein the intensity representation parameter of the digital data is an actual average power intensity of the digital data within a preset period of time, wherein the preset intensity threshold is a target average power intensity, wherein the intensity calculator comprises an average power calculator and a comparator, wherein the average power calculator calculates the actual average power intensity, and wherein the comparator compares the actual average power intensity with the target average power intensity to obtain a difference.

8. The radio frequency receiver according to claim 7, wherein the preset relationship threshold is a difference threshold comprising a first difference threshold and a second difference threshold that is less than the first difference threshold, wherein the automatic gain controller compares the difference with the first difference threshold and the second difference threshold, wherein the gain of the radio frequency component on the radio frequency data is increased when the difference is greater than or equal to the first difference threshold, wherein the gain of the radio frequency component on the radio frequency data is decreased when the difference is less than or equal to the second difference threshold, and wherein the gain of the radio frequency component on the radio frequency data is maintained when the difference is between the first difference threshold and the second difference threshold.

9. The radio frequency receiver according to claim 3, wherein the preset relationship threshold is a ratio threshold, and wherein the radio frequency receiver further comprises an average power calculator, wherein the average power calculator is configured to calculate an actual average power intensity of the digital data within a preset period of time, wherein the automatic gain controller compares a target average power intensity with the actual average power intensity to obtain a difference, and compares the difference with a first difference threshold and a second difference threshold, wherein the first difference threshold is greater than the second difference threshold, wherein the gain of the radio frequency component on the radio frequency data is increased when the difference is greater than or equal to the first difference threshold, wherein the gain of the radio frequency component on the radio frequency data is decreased when the difference is less than or equal to the second difference threshold, wherein the ratio with the ratio threshold is compared when the difference is between the first difference threshold and the second difference threshold, wherein the target average power intensity is decreased or maintained when the ratio is greater than or equal to the ratio threshold, and wherein the target average power intensity is increased or maintained when the ratio is less than the ratio threshold.

10. The radio frequency receiver according to claim 7, wherein the radio frequency receiver further comprises:
a base band filter configured to filter the digital data, and
a Fourier transformer configured to perform a Fourier transform on digital data that is filtered by the base band filter, wherein the average power calculator calculates the actual average power intensity of the digital data at at least one of, an input end of the base band filter, an output end of the base band filter, the input end and the output end of the base band filter, and an output end of the Fourier transformer.

11. The radio frequency receiver according to claim 10, wherein the radio frequency receiver further comprises:
a first digital gainer;
a second digital gainer; and a direct current eliminator configured to eliminate a direct current component from the digital data,
wherein the first digital gainer, coupled between the direct current eliminator and the base band filter, is configured to adjust an amplitude intensity of digital data that is obtained from eliminating the direct current component by the direct current eliminator and wherein the second digital gainer, coupled between the base band filter and the Fourier transformer, is configured to adjust an amplitude intensity of the digital data that is filtered by the base band filter.

12. The radio frequency receiver according to claim 2, further comprising a direct current eliminator configured to eliminate a direct current component from the digital data, wherein the amplitude intensity comparator compares an amplitude intensity, which is acquired at an input end or an output end of the direct current eliminator, of the digital data with the amplitude intensity threshold.

13. The radio frequency receiver according to claim 12, wherein the radio frequency receiver further comprises:
a first digital gainer;
a second digital gainer;
a base band filter configured to filter the digital data; and
a Fourier transformer that is configured to perform a Fourier transform on digital data that is filtered by the base band filter,
wherein the first digital gainer, coupled between the direct current eliminator and the base band filter, is configured to adjust an amplitude intensity of digital data that is obtained from eliminating the direct current component by the direct current eliminator, and wherein the second digital gainer, coupled between the base band filter and the Fourier transformer, is configured to adjust an amplitude intensity of the digital data that is filtered by the base band filter.

14. An automatic gain control method of a radio frequency receiver comprising a radio frequency component configured to receive radio frequency data and perform a gain adjustment on the radio frequency data, and an analog to digital converter configured to convert the radio frequency data obtained after the gain adjustment into digital data, wherein the method comprises:
calculating a relationship between an intensity representation parameter of the digital data and a preset intensity threshold within a preset calculation time;
comparing the calculated relationship with a preset relationship threshold to obtain a comparison result; and
adjusting a gain of the radio frequency component on the radio frequency data according to the comparison result, so that an amplitude of the radio frequency data obtained after the gain adjustment is within a receiving range of the analog to digital converter,
wherein the preset calculation time is less than a subframe period of the digital data, so that an adjustment is performed, in a latter-portion of a current subframe or in a fore-portion of a next subframe according to the comparison result, on a gain of the radio frequency component in a next subframe, and wherein calculating the relationship between the intensity representation parameter of the digital data and the preset intensity threshold within the preset calculation time further comprises:
comparing the intensity representation parameter with the preset intensity threshold; and calculating a quantity of times that the intensity representation parameter of the digital data is greater than or equal to the preset intensity threshold within the preset calculation time, so as to reflect the relationship between the intensity representation parameter and the preset intensity threshold by using the quantity of times,
wherein the relationship between the intensity representation parameter and the preset intensity threshold is a ratio of the quantity of times that the intensity representation parameter of the digital data is greater than or equal to the preset intensity threshold within the preset calculation time and a total quantity of times of comparison between the intensity representation parameter of the digital data and the preset intensity threshold.

15. The method according to claim 14, wherein the intensity representation parameter of the digital data is an amplitude intensity of the digital data, wherein the preset intensity threshold is an amplitude intensity threshold, and wherein calculating the relationship between the intensity representation parameter of the digital data and the preset intensity threshold within the preset calculation time further comprises:
comparing the amplitude intensity with the amplitude intensity threshold; and
calculating a quantity of times that the amplitude intensity of the digital data is greater than or equal to the amplitude intensity threshold within the preset calculation time, so as to reflect the relationship between the intensity representation parameter and the preset intensity threshold by using the quantity of times.

16. The method according to claim 15, wherein the ratio is a ratio of the quantity of times that the amplitude intensity of the digital data is greater than or equal to the amplitude intensity threshold within the preset calculation time and a total quantity of times of comparison between the amplitude intensity of the digital data and the amplitude intensity threshold.

17. The method according to claim 16, wherein the preset relationship threshold is a ratio threshold, and comparing the calculated relationship with the preset relationship threshold to obtain the comparison result, and adjusting the gain of the radio frequency component on the radio frequency data according to the comparison result further comprises:
comparing the ratio with the ratio threshold;
increasing the gain of the radio frequency component on the radio frequency data when the ratio is less than or equal to the ratio threshold; and maintaining the gain of the radio frequency component on the radio frequency data when the ratio is greater than the ratio threshold.

18. The method according to claim 16, wherein the preset relationship threshold is a ratio threshold, and comparing the calculated relationship with the preset relationship threshold to obtain the comparison result, and adjusting the gain of the radio frequency component on the radio frequency data according to the comparison result further comprises:
  comparing the ratio with the ratio threshold;
  decreasing the gain of the radio frequency component on the radio frequency data when the ratio is greater than or equal to the ratio threshold; and
  maintaining the gain of the radio frequency component on the radio frequency data when the ratio is less than the ratio threshold.

19. The method according to claim 16, wherein the amplitude intensity threshold comprises a first amplitude intensity threshold and a second amplitude intensity threshold, wherein the first amplitude intensity threshold is less than the second amplitude intensity threshold, wherein the ratio comprises a first ratio and a second ratio, wherein the first amplitude intensity threshold corresponds to the first ratio, the second amplitude intensity threshold corresponds to the second ratio, and the preset relationship threshold is a ratio threshold, and wherein comparing the calculated relationship with the preset relationship threshold to obtain the comparison result, and adjusting the gain of the radio frequency component on the radio frequency data according to the comparison result further comprises:
  separately comparing the first ratio and the second ratio with the ratio threshold, wherein the first ratio is greater than the second ratio;
  increasing the gain of the radio frequency component on the radio frequency data when the first ratio is less than or equal to the ratio threshold;
  maintaining the gain of the radio frequency component on the radio frequency data when the first ratio is greater than the ratio threshold and the second ratio is less than the ratio threshold; and
  decreasing the gain of the radio frequency component on the radio frequency data when the second ratio is greater than or equal to the ratio threshold.

20. The method according to claim 14, wherein the intensity representation parameter of the digital data is an actual average power intensity of the digital data within a preset period of time,
  wherein the preset intensity threshold is a target average power intensity, wherein calculating the relationship between the intensity representation parameter of the digital data and the preset intensity threshold within the preset calculation time further comprises:
  calculating the actual average power intensity; and
  comparing the actual average power intensity with the target average power intensity to obtain a difference.

21. The method according to claim 20, wherein the preset relationship threshold is a difference threshold comprising a first difference threshold and a second difference threshold that is less than the first difference threshold, and wherein comparing the calculated relationship with the preset relationship threshold to obtain the comparison result, and adjusting the gain of the radio frequency component on the radio frequency data according to the comparison result further comprises:
  comparing the difference with the first difference threshold and the second difference threshold;
  increasing the gain of the radio frequency component on the radio frequency data when the difference is greater than or equal to the first difference threshold;
  decreasing the gain of the radio frequency component on the radio frequency data when the difference is less than or equal to the second difference threshold; and
  maintaining the gain of the radio frequency component on the radio frequency data when the difference is between the first difference threshold and the second difference threshold.

22. The method according to claim 16, further comprising:
  calculating an actual average power intensity of the digital data within a preset period of time, wherein the preset relationship threshold is a ratio threshold, and wherein comparing the calculated relationship with the preset relationship threshold to obtain the comparison result, and adjusting the gain of the radio frequency component on the radio frequency data according to the comparison result further comprises:
  comparing a target average power intensity with the actual average power intensity to obtain a difference;
  comparing the difference with a first difference threshold and a second difference threshold, wherein the first difference threshold is greater than the second difference threshold;
  increasing the gain of the radio frequency component on the radio frequency data when the difference is greater than or equal to the first difference threshold;
  decreasing the gain of the radio frequency component on the radio frequency data when the difference is less than or equal to the second difference threshold;
  comparing the ratio with the ratio threshold when the difference is between the first difference threshold and the second difference threshold;
  decreasing or maintaining the target average power intensity when the ratio is greater than or equal to the ratio threshold; and
  increasing or maintaining the target average power intensity when the ratio is less than the ratio threshold.

* * * * *